(12) United States Patent
Hong et al.

(10) Patent No.: US 7,732,857 B2
(45) Date of Patent: Jun. 8, 2010

(54) THIN FILM TRANSISTOR SUBSTRATE AND DISPLAY APPARATUS HAVING THE SAME

(75) Inventors: Song-mi Hong, Hwaseong-si (KR); Jung-soo Rhee, Seoul (KR); Beohm-rock Choi, Seoul (KR); Jin-koo Chung, Suwon-si (KR); Jianpu Wang, Suwon-si (KR); Dong-won Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/276,203

(22) Filed: Nov. 21, 2008

(65) Prior Publication Data

US 2009/0101917 A1  Apr. 23, 2009

Related U.S. Application Data

(63) Continuation of application No. 11/403,172, filed on Apr. 11, 2006, now Pat. No. 7,470,950.

(30) Foreign Application Priority Data

May 23, 2005  (KR)  ............... 10-2005-0043059

(51) Int. Cl.
*H01L 29/792* (2006.01)
(52) U.S. Cl. .............. 257/326; 257/236; 257/347; 438/149; 438/152
(58) Field of Classification Search ........... 257/236, 257/347, 350, 353; 438/149, 152, 153, 155
See application file for complete search history.

(56) References Cited

U.S. PATENT DOCUMENTS

| 6,977,410 B2 * | 12/2005 | Naso et al. ............ 257/316 |
| 7,218,048 B2 * | 5/2007 | Choi et al. ............ 313/504 |
| 7,295,466 B2 * | 11/2007 | Lambrache et al. .... 365/185.02 |
| 2006/0124931 A1 * | 6/2006 | Choi et al. ............ 257/59 |

FOREIGN PATENT DOCUMENTS

| JP | 2004-47963 | 2/2004 |
| KR | 2003-075921 | 9/2003 |
| KR | 2004-062068 | 7/2004 |

* cited by examiner

*Primary Examiner*—Phuc T Dang
(74) *Attorney, Agent, or Firm*—Innovation Counsel LLP

(57) ABSTRACT

A TFT substrate with reduced pixel defect rate is presented. The TFT substrate includes a pixel electrode, a negative line to apply a reverse voltage to the pixel electrode, and a recovery transistor including a drain electrode overlapping a part of the negative line with a insulating layer disposed between the negative line and the drain electrode. A contact hole is formed on the negative line and the drain electrode, and a bridge electrode connects the negative line and the drain electrode through the contact hole.

The thin film transistor substrate and a display apparatus presented herein protect a data line assembly metal layer and decrease pixel defect. An improved reverse voltage efficiency is applied to a pixel electrode to protect a drain electrode.

16 Claims, 9 Drawing Sheets

THIN FILM TRANSISTOR SUBSTRATE AND DISPLAY APPARATUS HAVING THE SAME

CROSS-REFERENCE TO RELATED APPLICATIONS

The present application is a continuation application of U.S. patent application Ser. No. 11/403,172 filed on Apr. 11, 2006, now U.S. Pat. No. 7,470,950, which claims the benefit of Korean Patent Application No. 2005-0043059 filed on May 23, 2005 in the Korean Intellectual Property Office, the disclosures of which are incorporated herein by reference.

BACKGROUND OF THE INVENTION

1. Field of the Invention

The present invention relates to a thin film transistor substrate and a display apparatus having the same, and more particularly to a thin film transistor substrate and a display apparatus using the thin film transistor substrate and having a pixel electrode on which a light emitting layer is formed.

2. Description of the Related Art

Today, OLED (organic light emitting diode) is a popular type of flat panel display that is especially appreciated for its low voltage-driving, light weight, slim shape, wide angular field, and quick response. OLED displays are generally classified into two categories depending on the driving method: a passive matrix and an active matrix. The passive matrix OLED is simple in its manufacturing process but has the disadvantage of dramatically increased power consumption with increases in the size of the display and the resolution. Due to this disadvantage, the use of passive matrix is somewhat limited to a small-sized display apparatuses. While the active matrix OLED is more useful for large displays and high resolution, its manufacturing process is more complicated.

A plurality of TFT transistors are provided on the OLED substrate to drive and an anode electrode forming a pixel and a cathode functioning as a reference voltage are formed on the TFT. When a voltage is applied to the two electrodes, an exciton is formed by combination of a hole and an electron. The exciton emits light in a light emitting layer interposed between the two electrodes. The OLED displays images by adjusting this emitted light.

A plurality of TFTs are formed on the OLED substrate. A switching transistor connected to a data line and a driving transistor connected to a voltage supply line form a pixel. A data line assembly metal layer is deposited and formed into a source electrode and a drain electrode. A plurality of contact holes are formed to connect wires when a plurality of TFTs are formed. However, these contact holes can be problematic when an etchant flows through the contact hole during processing and causes wire lifting.

Wire lifting poses a problem especially around a boundary area where a gate line assembly metal layer overlaps the data line assembly metal layer due to a height difference between the metal layers. A thin protective layer is formed at the boundary area. When the contact hole is formed on the thin protective layer, the wire lifting is largely induced by the etchant and it becomes difficult to apply a normal voltage to the pixel.

SUMMARY OF THE INVENTION

Accordingly, it is an aspect of the present invention to provide a thin film transistor substrate and a display apparatus having the same that protect a data line assembly metal layer and decrease pixel defect.

The thin film transistor substrate and a display apparatus having the same include an improved reverse voltage efficiency applied to a pixel electrode as a drain electrode is protected.

In one aspect, the invention is a TFT substrate including a pixel electrode; a negative line to apply a reverse voltage to the pixel electrode; a recovery transistor comprising a drain electrode overlapping a part of the negative line with an insulating layer disposed between the negative line and the drain electrode; a contact hole formed on the negative line and the drain electrode; and a bridge electrode connecting the negative line and the drain electrode through the contact hole.

The contact hole may not overlap a boundary area between the negative line and the drain electrode.

There may be multiple contact holes.

The area of a base of the contact hole disposed on the drain electrode may be approximately $50\ \mu m^2 \sim 100\ \mu m^2$. The area of the base of the contact hole disposed on the negative line is approximately $40\ \mu m^2 \sim 70\ \mu m^2$.

According to the embodiment of the present invention, the contact hole has an approximately rectangular base, a short side of the rectangle is parallel to a width direction of the negative line, and a length of the short side is approximately one-third of the width of the negative line.

The bridge electrode may be made of ITO, IZO, a-ITO or a-IZO.

The TFT substrate may further include a recovery line to apply a recovery-on voltage to the recovery transistor.

The TFT substrate may further include a gate line; a data line extending substantially perpendicularly to the gate line; and a switching transistor disposed near where the gate line and the data line overlap. The switching transistor applies a data voltage.

The negative line may be provided on the same layer as the gate line.

The TFT substrate may also include a voltage supply line applying a driving voltage to the pixel electrode and a driving transistor applying a voltage that is about equal to the difference between the data voltage and the driving voltage to the pixel electrode.

The voltage supply line may be provided parallel to the data line, and the data line and the voltage supply line may be alternately provided between the adjacent pixel electrodes.

The data line may be provided in pairs between the adjacent two pixel electrodes.

The voltage supply line may be provided on the same layer as the data line.

In another aspect, the invention is a display apparatus including a pixel electrode; a negative line to apply a reverse voltage to the pixel electrode; a recovery transistor comprising a drain electrode overlapping a part of the negative line; a contact hole formed on the negative line and the drain electrode; a bridge electrode connecting the negative line and the drain electrode through the contact hole; and a light emitting layer provided on the pixel electrode.

BRIEF DESCRIPTION OF THE DRAWINGS

The above and/or other aspects and advantages of the present invention will become apparent and more readily appreciated from the following description of the exemplary embodiments, taken in conjunction with the accompanying drawings of which.

DETAILED DESCRIPTION OF THE EMBODIMENTS

Figure 1:
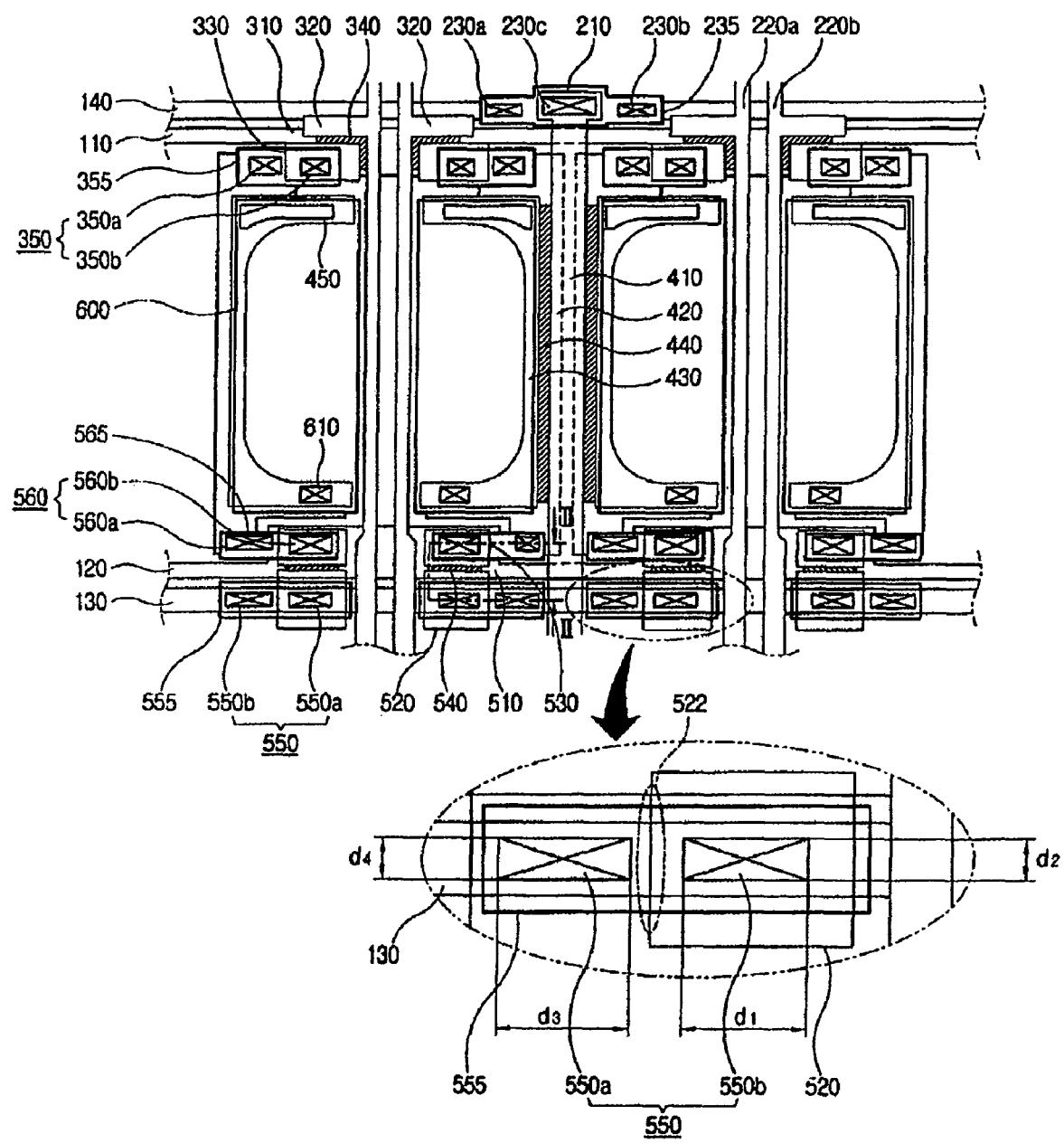
FIG. 1 is a plan view of a TFT substrate according to a first embodiment of the present invention.

Reference will now be made in detail to exemplary embodiments of the present invention, examples of which are illustrated in the accompanying drawings wherein like reference numerals refer to like elements throughout. The embodiments are described below in order to explain the present invention by referring to the figures.

A first embodiment according to the present invention will be described with reference to FIGS. 1 through 5.

FIG. 1 is a plan view of a TFT substrate according to a first embodiment of the present invention. A TFT substrate used for an OLED (organic light emitting diode) will be explained as an example in the embodiment but may be used for any other display apparatus.

As shown in FIG. 1, the TFT substrate includes a gate line assembly metal layer 110, 120, 130, 140, 310, 410, 510; a data line assembly metal layer 210, 220, 320, 420, 520; a switching transistor 300; a driving transistor 400; a recovery transistor 500; and a pixel electrode 600. The gate line assembly metal layer (which is used to form a gate line 110, a recovery line 120, a negative 130, a driving voltage applying line and gate electrodes 140, 310, 410, 510); the data line assembly metal layer (which is used to form a voltage supply line 210, data line 220, and drain electrodes 320, 420, 520); and a transparent electrode substance layer forming the pixel electrode 600 and bridge electrodes 235, 355, 555, 565 are provided as different layers.

The gate line assembly metal layer includes the gate line 110 extending in a first direction; the recovery line 120 formed parallel to the gate line 110 and carrying a recovery-on voltage; the negative line 130 to apply a reverse voltage to the pixel electrode 600; the driving voltage applying line 140 to apply a driving voltage to a voltage supply line 210; and gate electrodes 310, 410, 510 of transistors 300, 400, 500, respectively.

The data line assembly metal layer includes the voltage supply line 210 that extends substantially perpendicular to the gate line 110; the data line 220 to which a data voltage is applied; drain electrodes 320, 420, 520 of transistors 300, 400, 500, respectively; and source electrodes 330, 430, 530.

The voltage supply line 210 and the data line 220 are provided parallel to each other and extend substantially perpendicular to the gate line 110, thereby forming a pixel area in a matrix configuration. The pixel electrode 600 is formed in each pixel area and the voltage supply line 210 and the data line 220 are alternately arranged between the two pixel electrodes 600. That is, the voltage supply line 210 and the data line 220 are disposed between the adjacent pixel electrodes 600 in a second direction that is substantially perpendicular to the first direction.

Generally, one pixel electrode 600 is connected to each one of the voltage supply line 210 and the data line 220. However, in the embodiment shown, two pixel electrodes 600 share one voltage supply line 210. Namely, the two adjacent pixel electrodes 600 arranged on the voltage supply line 210 receive the driving voltage from the same voltage supply line 210.

This shared-voltage-supply line configuration simplifies the manufacturing process by decreasing the number of a lines and voltage-application points. Hence, an electro magnetic interference is improved. Furthermore, since an area of the pixel electrode 600 increases as the number of the line decreases, the aperture ratio is improved.

The driving voltage applying line 140 and the voltage supply line 210 are electrically connected through a first bridge electrode 235 connecting a contacting hole 230a, 230b exposing the driving voltage applying line 140 and a contacting hole 230c exposing the voltage supply line 210. The first bridge electrode 235 and a second through a fourth bridge electrodes 355, 555, 565, which are described below, are usually made of a transparent conductive substance such as ITO (indium tin oxide), IZO (indium zinc oxide), a-ITO (amorphous-indium tin oxide), a-IZO (amorphous-indium zinc oxide) and the like.

The data lines 220a, 220b (collectively referred to as "data line 220") are arranged in a pair between the pixel electrodes 600. Each of the two data lines 220a, 220b are indirectly connected to the adjacent pixel electrode 600 and apply the data voltage to the pixel electrode 600. The data lines 220a, 220b are not limited to being arranged like in the embodiment. For example, they may be arranged between the adjacent pixel electrodes 600 as one data line. However, when planning the layout of the data line 220, it should be taken into consideration that the switching transistor 300 connected to the data line 220a, 220b and the driving transistor 400 connected to the voltage supply line 210 are electrically connected.

Figure 2:
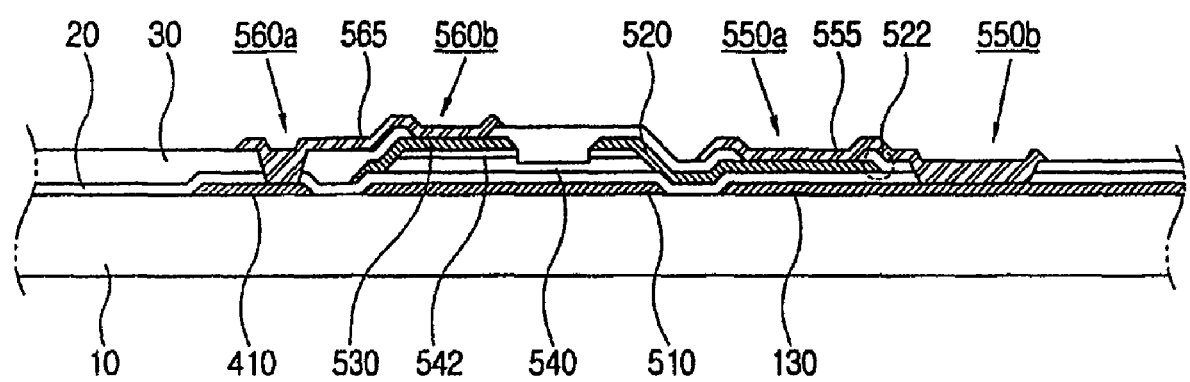
FIG. 2 is a sectional view of FIG. 1, taken along line II-II.

The transistors 300, 400, 500 will be described with reference to FIGS. 2 and 3a through 3d. FIG. 2 is a sectional view of FIG. 1 taken along line II-II and shows the recovery transistor 500 connected to other electrodes through four contacting holes 560a, 560b, 550a, 550b and the bridge electrode 555, 565. The recovery transistor 500, the switching transistor 300, and the driving transistor 400 have a similar basic configuration except for the contact hole 550a, 560b.

The gate line assembly metal layer 130, 410, 510 is formed on the substrate substance 10. The gate line assembly 130, 410, 510 may be made of a metal in a single-layer or in a multi-layer. The gate line assembly 130, 410, 510 includes the gate electrode 410 of the driving transistor 400 branching from the gate line 110, the gate electrode 510 of the recovery transistor 500 forming a part of the recovery line 120, and the negative line 130.

A gate insulating layer 20 made of SiNx (silicon nitride) and the like covers the gate line assembly metal layer 130, 410, 510.

A semiconductor layer 540 made of a semiconductor such as amorphous silicon and the like is formed on the gate insulating layer 20 of the gate electrode 510 of the recovery transistor 500. On the semiconductor layer 540 are formed an ohmic contact layer 542 made of n+ hydrogenated amorphous silicon highly-doped with silicide or n-type dopant.

The data line assembly metal layer, which includes a drain electrode 520 and a source electrode 530, is formed on the ohmic contact layer 542 and the gate insulating layer 30. The data line assembly metal layer may also be made of a metal in a single-layer or in a multi-layer structure. The data line assembly metal layer includes the source electrode 530 connected to the gate electrode 410 of the driving transistor 400 and the drain electrode 520 separated from the source electrode 530 and formed on the ohmic contact layer 542 on the recovery line 120. The drain electrode 520 overlaps the negative line 130. In brief, the drain electrode 520 of the recovery transistor 500 overlaps the negative line 130, and the source electrode 530 of the recovery transistor 500 overlaps the gate electrode 410 of the driving transistor 400.

A protective layer 30 made of silicon nitride, an a—Si:C:O layer or an a—Si:O:F layer deposited by the PECVD method, an acryl organic insulating layer, etc. is formed on the data line assembly metal layer (which includes the drain and source electrodes 520, 530). The semiconductor layer 540 is not covered by the protective layer 30. On the protective layer 30 are formed the gate electrode 410 of the driving transistor 400, the source electrode 530, the drain electrode 520, and the contact hole 550a, 550b, 560a, 560b exposing the negative line 130.

The third bridge electrode 555 and the fourth bridge electrode 565 are formed on the protective layer 30. The third bridge electrode 555 and the fourth bridge electrode 565 are made of transparent conductive substance ITO, IZO, a-ITO, a-IZO, etc.

Conventionally, only one contact hole that passes through the drain electrode 520 of the recovery transistor 500 and the negative line 130 is formed. Likewise, when the contact hole is formed on a boundary area 522 where the data line assembly metal layer like the drain electrode 520 and the gate line assembly metal layer like the negative line 130 overlap, the protective layer is made thinner than in other places due to a height difference between the two layers in the area.

In a conventional OLED display, an etchant, used when the bridge electrode is formed, flows into the boundary area 522 and causes the bridge electrode (e.g., 555) to be lifted. However, in this embodiment, the lifting is avoided because there is no contact hole in the boundary area 522, and the protective layer 30 is formed on the boundary area 522 where the drain electrode 520 and the negative line 130 overlap. Each of the contact holes 550a, 550b has enough area for the reverse voltage applied from the negative line 130 to be transmitted to the recovery transistor 500. The area of the base of the contact hole 550a disposed on the negative line 130 is preferably about 40 µm²~70 µm² and an area of the base of the contact hole 550b disposed on the drain electrode 520 is preferably about 50 µm²~100 µm². The contact hole 550a has a nearly rectangular shape with two short sides d2, d4 and two long sides d1, d3. The short sides d2, d4 of the rectangle are formed parallel to a width of the negative line 130 measured in the second direction. The length of the short sides d2, d4 is preferably about one-third of the width of the negative line 130. When the width of the negative line 130 is about 12 µm and the contact hole 550a is formed in a rectangular shape on the drain electrode 520, the long side d1 may be 15 µm~20 µm and the short side d2 may be 4 µm. Furthermore, as for the contact hole 550b disposed on the negative line 130, the long side d3 is preferably 14 µm~16 µm and the short side d4 is preferably 4 µm.

Provided that the contact holes 550a, 550b have a predetermined area for the base and remain outside the boundary area 522, they may be formed in any suitable shapes and numbers.

FIGS. 3a through 3d shows a manufacturing method of the TFT substrate, more particularly, of the recovery transistor.

Figure 3A:
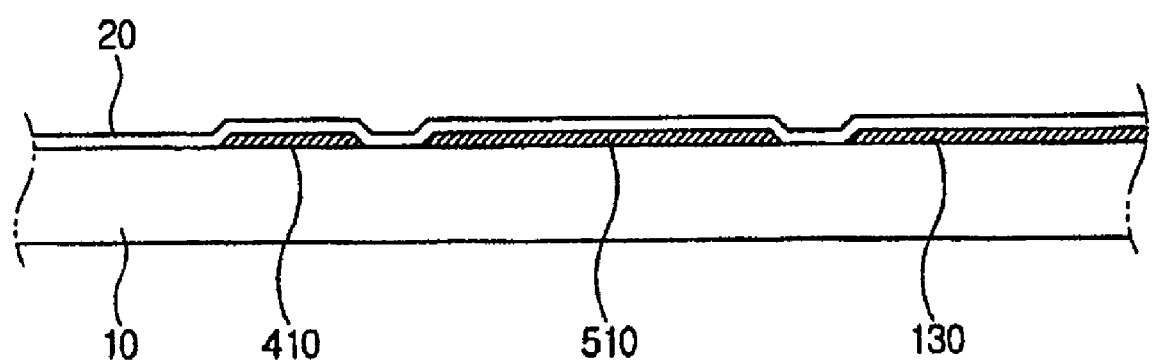
FIGS. 3a through 3d are views describing a manufacturing method of the TFT substrate according to the first embodiment.
Figure 3B:
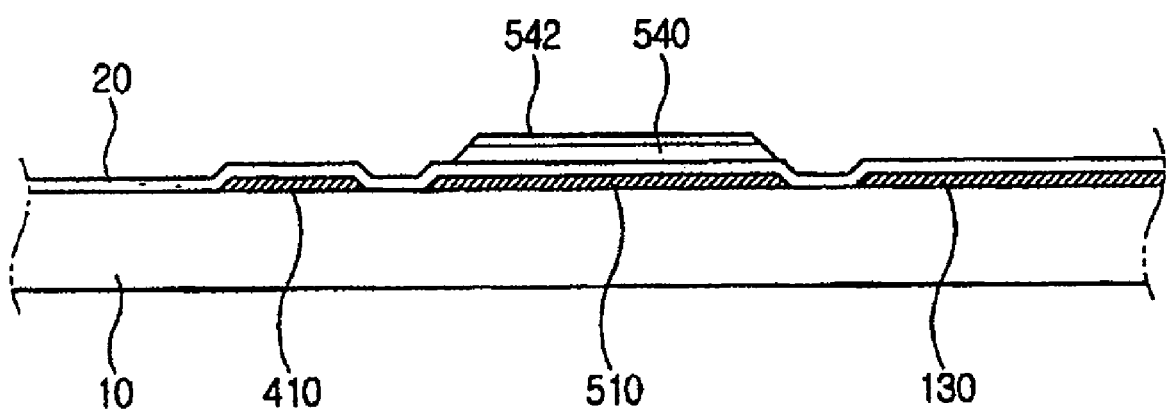

First, the gate line assembly substance is deposited on the substrate 10 and patterned by a photolithography using a mask, to thereby form the gate line assembly metal layer that includes the gate electrode 410 of the driving transistor 400, the gate electrode 510 of the recovery transistor 500, and the negative line 130. Then, the gate insulating layer 20 is deposited on the gate line assembly metal layer. As shown in FIG. 3b, the semiconductor layer 540 and the ohmic contact layer 542 are orderly deposited on the gate electrode 510 and patterned by photolithography using a mask, thereby forming the semiconductor layer 540 and the ohmic contact layer 542 as islands on the gate insulating layer 20 on the gate electrode 510.

Figure 3C:
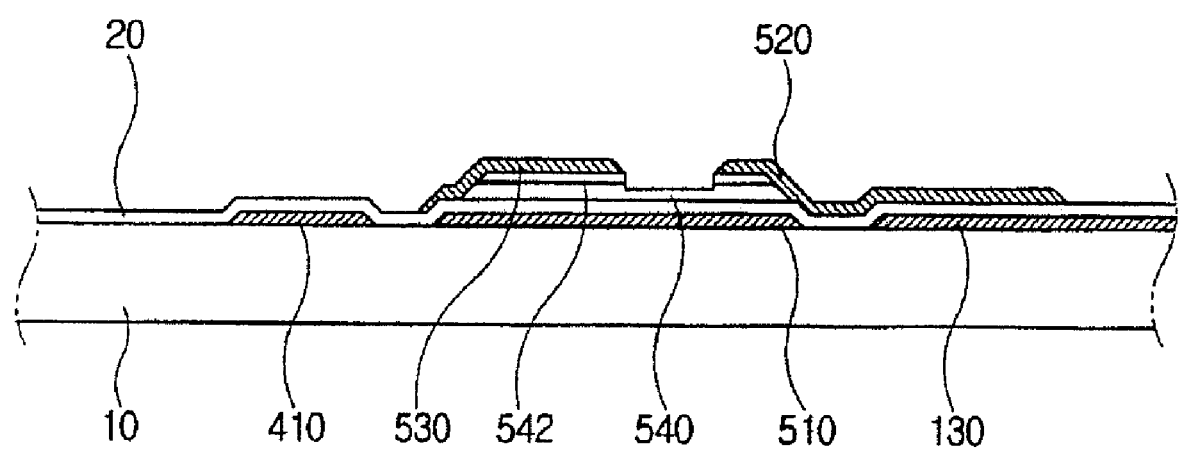
Figure 3D:
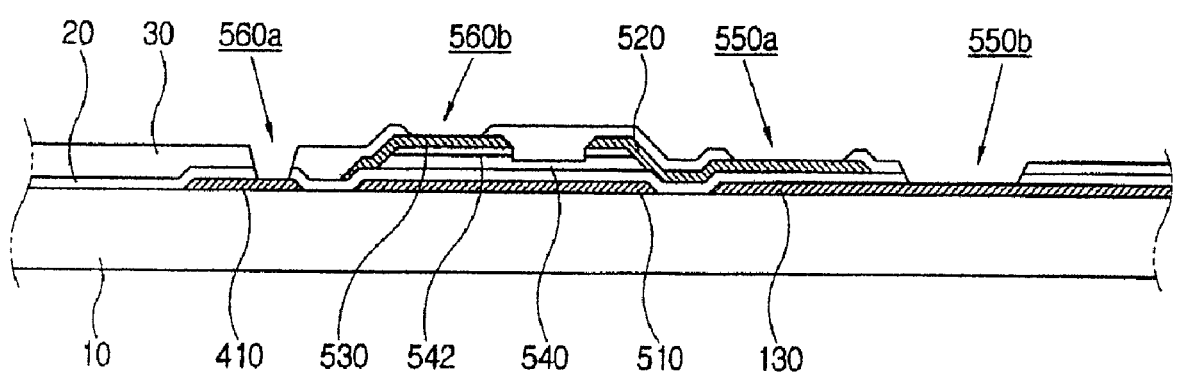

Next, as shown in FIG. 3c, after the data line assembly material is deposited, it is patterned by photolithography using a mask to form the data line assembly metal layer including the source electrode 530 across to the recovery line 120 and the drain electrode 520 separated from the source electrode 530. Thereafter, the portion of the ohmic contact layer 542 not overlapped by the data line assembly layer is etched, thereby exposing the semiconductor layer 540. Subsequently, as shown in FIG. 3d, the protective layer 30 is formed. The protective layer 30 is formed by the PECVD method using silicon source gas and nitrogen source gas. When the protective layer 30 is etched by an etching gas including hydrochloric acid, the contact hole 560a exposes at least a part of the gate electrode 410 of the driving transistor 400, the contact hole 560b exposes at least a part of the source electrode 530, the contact hole 550a exposes at least a part of the drain electrode 520, and the contact hole 550b exposes at least a part of the negative line 130.

Finally, the transparent conductive substance such as ITO, IZO, a-ITO, or a-IZO is deposited on the protective layer 30. As shown in FIG. 2, the transparent conductive substance is patterned by photolithography using a mask to form the fourth bridge electrode 565 and the third bridge electrode 555. The third bridge electrode 555 connects the drain electrode 520 to the negative line 130. The fourth bridge electrode 565 connects the gate electrode 410 of the driving transistor 400 to the source electrode 530. A Cr etchant or an IZO etchant may be used according to the transparent conductive substance when the bridge electrodes 555, 565 are formed.

The switching transistor 300 includes the gate electrode 310 forming a part of the gate line 110, the drain electrode 320 branching from the voltage supply line 220a, 220b, the source electrode 330 separated from the drain electrode 320, and the semiconductor layer 340 formed between the drain electrode 320 and the source electrode 330.

The driving transistor 400 includes the gate electrode 410 formed under the voltage supply line 210, the drain electrode 420 formed in a part of the driving voltage line 210 and formed on the gate electrode 410, the source electrode 430 separated from the drain electrode 420 and expanded to the pixel area, and the semiconductor layer 440 extending in the second direction between the drain electrode 420 and the source electrode 430 along the voltage supply line 210. The contact hole 450 (see FIG. 5) is formed in order to connect the pixel electrode 600 to the source electrode 430.

The pixel electrode 600 applied with an image signal from the source electrode 430 is formed on the protective layer 30. The pixel electrode 600 is physically and electrically connected to the source electrode 430 through the contact hole 450 and receives the image signal.

A partition is formed on the pixel electrode 600 in order to separate a radiating layer (not shown) from the pixel electrode 600. The pixel electrode 600 is aligned with an anode electrode that receives the image signal.

The contact hole 610 is for storage capacitor (Cst) and is electrically connected to the gate electrode 410 of the driving transistor 400 with the pixel electrode 600. The storage capacitor (Cst) stores a voltage corresponding to the difference between the data voltage and the driving voltage and regularly maintains the stored voltage during a frame.

Figure 4:
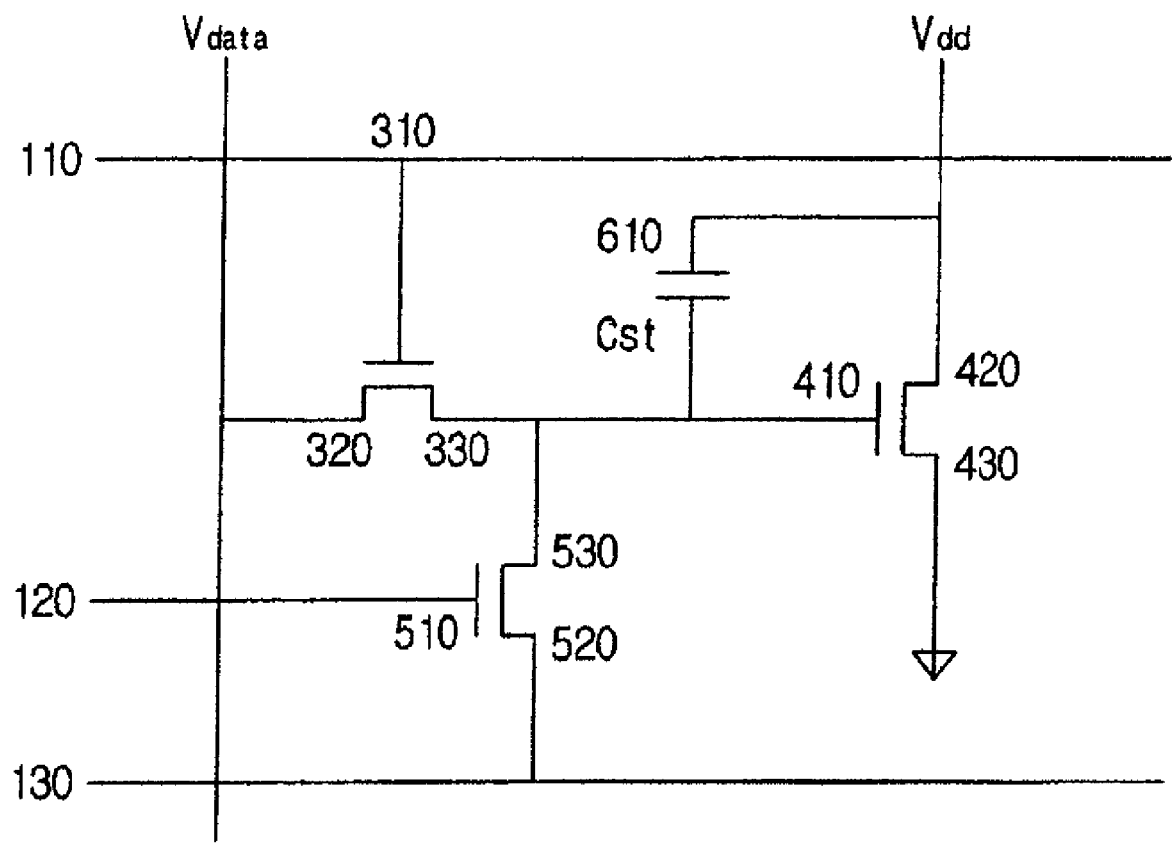
FIG. 4 is an equivalent circuit diagram of a pixel according to the first embodiment of the present invention.

FIG. 4 is an equivalent circuit diagram of a pixel according to the first embodiment of the present invention. A signal transmitting process will be described with reference to FIG. 4.

First, a gate-on voltage applied to the gate line 110 is transmitted to the gate electrode 310 of the switching transistor 300. In response to the gate-on voltage, the data voltage applied from the data line 220a, 220b flows out to the source electrode 330 through the drain electrode 320. The source electrode 330 of the switching transistor 300 is electrically connected to the gate electrode 410 of the driving transistor 400 through the contact hole 350a, 350b and the second bridge electrode 355.

The driving transistor 400 controls current of a light emitting layer (see FIG. 5) with the data voltage applied to the gate electrode 410 and the driving voltage applied form the driving supply line. The current of the light emitting layer is proportional to the difference between the data voltage applied from the gate electrode 410 and the driving voltage applied from the drain electrode 420.

The capacitor (Cst) stores the voltage corresponding to the difference between the data voltage and the driving voltage and regularly maintains the data voltage applied to the gate electrode 410 of the driving transistor 400 and the electric current applied to the pixel electrode 600 during a frame.

The recovery transistor 500 applies a reverse voltage to the driving transistor 400 so that a residual electric current is not accumulated in the driving transistor 400. Since the drain electrode 420 of the driving transistor 400 is applied with the regular driving voltage, residual electric current may accumulate in the driving transistor 400, preventing proper transmission of the image signal to the pixel electrode 600. To prevent this problem, a reverse voltage is applied to the driving transistor 400, thereby discharging the accumulated electric current. Namely, the electric current passing through the driving transistor 400 is applied with a reverse bias voltage.

The gate-on voltage is applied to the gate line 110, and the recovery-on voltage is applied to the recovery line 120. When the recovery transistor is turned on by the recovery-on voltage, the reverse voltage applied from the negative line 130 is transmitted to the gate electrode 410 of the driving transistor 400 through the drain electrode 520 and the source electrode 530.

Figure 5:
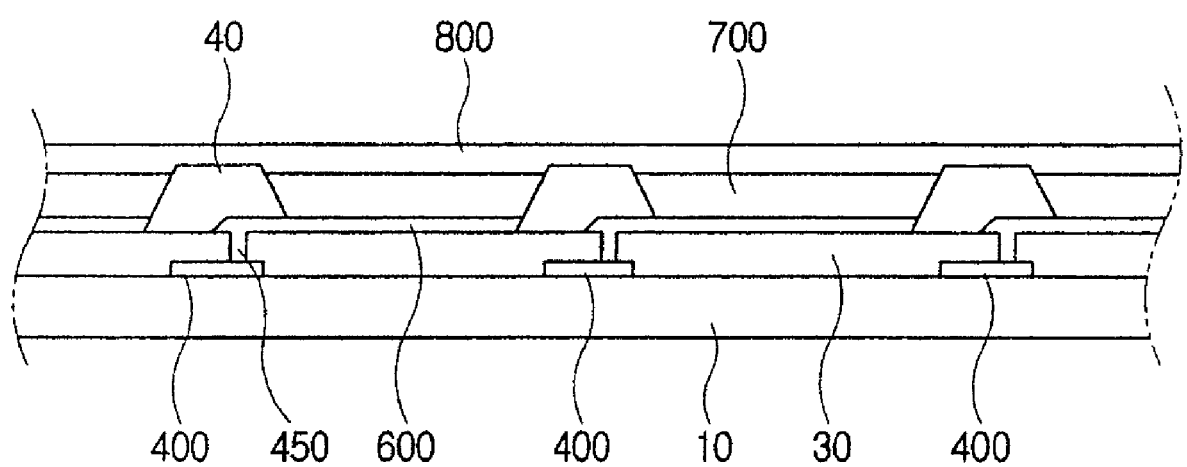
FIG. 5 is a sectional view of a display apparatus according to the first embodiment of the present invention.

FIG. 5 is a sectional view of a display apparatus according to the first embodiment. The display apparatus includes the partition 40 formed on the TFT 400 and separating the pixel area, the light emitting layer 700 formed on the pixel electrode 600, and the cathode electrode 800 formed on the surface of the substrate. The pixel electrode 600 is connected to the drain electrode of the TFT 400 through the contact hole 450 formed on the protective layer 30. The pixel electrode 600 acts as an anode and provides holes (positive charge carriers) to the light emitting layer 700.

The partition 40 made of the organic substance is formed between the pixel areas. The partition 40 prevents the pixel electrodes from being short-circuited and separates the pixel electrodes from one another.

The cathode electrode 800 is provided on the light emitting layer 700 and is usually made of an opaque substance such as aluminum, silver, etc. The cathode electrode 800 is made of a metal having a low work function and/or a transparent conductive substance. The metal with a low work function allows an electron to easily transfer into the light emitting layer 700. Although light may exit in either/both directions of the substrate 10 depending on the desired application, light exits in the direction of the substrate 10 in the embodiment shown.

Although not shown in FIG. 5, OLED may further include a protective layer to protect the cathode electrode 800 and a paper bag to prevent moisture and air from infiltrating the light emitting layer 700.

Figure 6:
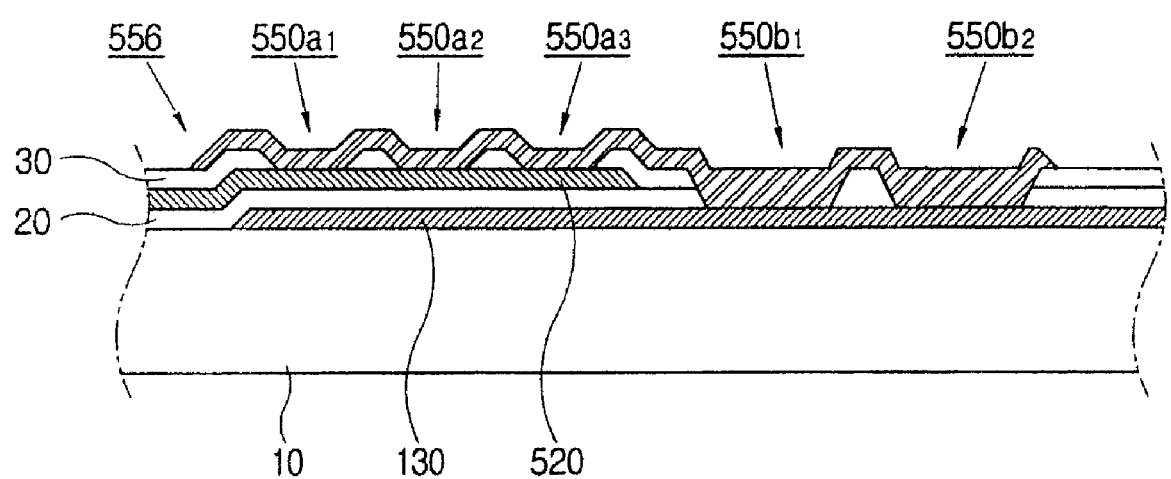
FIG. 6 is a sectional view of a TFT substrate according to a second embodiment of the present invention.

FIG. 6 is a sectional view of a TFT substrate according to a second embodiment of the present invention. FIG. 6 has the same configuration as the above-described embodiments except for the TFT substrate and the contact hole in FIG. 2. Thus, the description of the configuration will not be repeated.

Three of contact holes 550a1, 550a2, 550a3 are formed on a drain electrode 520 of a recovery transistor 500 and two of contacts holes 550b1, 550b2 are formed on a negative line 130. A third bridge electrode 556 is formed on the contact holes 550a1, 550a2, 550a3, 550b1, 550b2.

As compared with FIG. 2, multiple contact holes are disposed on the drain electrode 520 and the negative line 130. In this case, the contact holes 550a1, 550a2, 550a3 on the drain electrode 520 may have a rectangular base with the long sides being about 4 μm~5 μm and the short sides being about 4 μm. The contact holes 550b1, 550b2 may have a rectangular base with the long sides being about 5 μm~6 μm and the short sides being about 4 μm. However, these sizes are just examples and the contact holes may have any suitable size unless they overlap a boundary of the drain electrode 520.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A TFT substrate comprising:
   a gate line coupled to a first transistor;
   a negative line transmitting a reverse voltage;
   a second transistor comprising a drain electrode overlapping a part of the negative line with an insulating layer disposed between the negative line and the drain electrode;
   a contact hole formed on the negative line and the drain electrode; and
   a bridge electrode connecting the negative line and the drain electrode through the contact hole.

2. The TFT substrate according to claim 1, further comprising:
   a data line insulated from the gate line;
   a voltage supply line; and
   a pixel electrode.

3. The TFT substrate according to claim 2, wherein the voltage supply line is parallel to the data line, and the data line and the voltage supply line are alternately provided.

4. The TFT substrate according to claim 2, wherein the voltage supply line is provided on the same layer as the data line.

5. The TFT substrate according to claim 2, wherein the first transistor is coupled to the data line.

6. The TFT substrate according to claim 2, further comprising a third transistor coupled to the first transistor, the voltage supply line and the pixel electrode.

7. The TFT substrate according to claim 6, wherein the second transistor is coupled to a gate electrode of the third transistor.

8. The TFT substrate according to claim 2, further comprising a light emitting layer provided on the pixel electrode.

9. The TFT substrate according to claim 1, wherein the contact hole does not overlap a boundary area between the negative line and the drain electrode.

10. The TFT substrate according to claim 1, wherein an area of a base of the contact hole disposed on the drain electrode is approximately 50 μm²-100 μm².

11. The TFT substrate according to claim 1, wherein an area of a base of the contact hole disposed on the negative line is approximately 40 $\mu m^2$-70 $\mu m^2$.

12. The TFT substrate according to claim 1, wherein the contact hole has an approximately rectangular base, a short side of the rectangle is parallel to a width direction of the negative line, and a length of the short side is approximately one-third of the width of the negative line.

13. The TFT substrate according to claim 1, wherein the bridge electrode comprises indium tin oxide, indium zinc oxide, amorphous indium tin oxide or amorphous indium zinc oxide.

14. The TFT substrate according to claim 1, further comprising a recovery line to apply a recovery-on voltage to the second transistor.

15. The TFT substrate according to claim 1, wherein the first transistor apply a data voltage.

16. The TFT substrate according to claim 1, wherein the negative line is provided on the same layer as the gate line.

* * * * *